United States Patent
Zang et al.

(10) Patent No.: US 10,068,766 B2
(45) Date of Patent: *Sep. 4, 2018

(54) OXIDIZING AND ETCHING OF MATERIAL LINES FOR USE IN INCREASING OR DECREASING CRITICAL DIMENSIONS OF HARD MASK LINES

(71) Applicant: GLOBALFOUNDRIES Inc., Grand Cayman (KY)

(72) Inventors: Hui Zang, Guilderland, NY (US); Min-hwa Chi, San Jose, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 217 days.

This patent is subject to a terminal disclaimer.

(21) Appl. No.: 15/093,310

(22) Filed: Apr. 7, 2016

(65) Prior Publication Data

US 2017/0294309 A1 Oct. 12, 2017

(51) Int. Cl.
| H01L 21/033 | (2006.01) |
| H01L 21/02 | (2006.01) |
| H01L 21/311 | (2006.01) |
| H01L 21/8234 | (2006.01) |
| H01L 21/308 | (2006.01) |
| H01L 21/3213 | (2006.01) |

(52) U.S. Cl.
CPC ...... *H01L 21/0337* (2013.01); *H01L 21/3086* (2013.01); *H01L 21/32139* (2013.01); *H01L 21/823412* (2013.01); *H01L 21/823431* (2013.01); *H01L 21/823456* (2013.01)

(58) Field of Classification Search
CPC ........... H01L 21/0337; H01L 21/02238; H01L 21/0332; H01L 21/31105; H01L 21/823456; H01L 21/823475
See application file for complete search history.

(56) References Cited

U.S. PATENT DOCUMENTS

| 8,513,131 B2 | 8/2013 | Cai et al. |
| 9,455,347 B1 | 9/2016 | Leobandung |

(Continued)

OTHER PUBLICATIONS

Lapeyre, C., et al., "Cost Effective SADP based on Spin on Carbon," Proc. Int. Symp. on Lithography Extensions, Oct. 20-22, 2010, pp. 1-25. Oct. 22, 2010.

(Continued)

*Primary Examiner* — Seahvosh Nikmanesh
(74) *Attorney, Agent, or Firm* — Heslin Rothenberg Farley & Mesiti P.C.; Stephen Scuderi

(57) ABSTRACT

A method includes, for example, providing a starting semiconductor structure having a plurality of material lines disposed over a hard mask, and the hard mask disposed over a patternable layer, forming a protective layer over a portion of at least one material line, the at least one protected material line and at least one unprotected material line having a same critical dimension, oxidizing the at least one unprotected material line to increase the critical dimension compared to the first critical dimension of the at least one protected material line, and etching at least a portion of the oxidized unprotected material line so that the etched critical dimension of the at least one etched material line is different from the first critical dimension of the at least one protected material line.

20 Claims, 14 Drawing Sheets

(56) References Cited

U.S. PATENT DOCUMENTS

| | | | |
|---|---|---|---|
| 9,502,231 | B2 | 11/2016 | Liu et al. |
| 9,799,514 | B1* | 10/2017 | Zang .................. H01L 21/0337 |
| 2011/0147811 | A1 | 6/2011 | Kavalieros et al. |
| 2012/0313170 | A1 | 12/2012 | Chang et al. |
| 2013/0299875 | A1 | 11/2013 | Hong |
| 2014/0217508 | A1 | 8/2014 | Chang et al. |
| 2015/0021690 | A1 | 1/2015 | Jacob et al. |
| 2015/0064912 | A1 | 3/2015 | Jang et al. |
| 2016/0020109 | A1 | 1/2016 | Yoo |
| 2016/0064224 | A1 | 3/2016 | Hung et al. |
| 2016/0163555 | A1 | 6/2016 | Jang et al. |
| 2016/0240629 | A1 | 8/2016 | Liou et al. |
| 2016/0293443 | A1 | 10/2016 | Ban et al. |

OTHER PUBLICATIONS

Hui et al., U.S. Appl. No. 15/093,292, filed Apr. 7, 2016, entitled Protecting, Oxidizing, and Etching of Material Lines for Use in Increasing or Decreasing Critical Dimensions of Hard Mask Lines (3718.324/HMLT101A). Apr. 7, 2016.

Peddeti, U.S. Appl. No. 15/093,272, filed Apr. 7, 2016, entitled "Integration of Nominal Gate Width Finfets and Devices Having Larger Gate Width" (3718.312/HMLT071) Apr. 7, 2016.

Peddeti et al., U.S. Appl. No. 15/093,212, filed Apr. 7, 2016, entitled "Oxidizing Filler Material Lines to Increase Width of Hard Mask Lines" (3718.311/HMLT100) Apr. 7, 2016.

Peddeti, U.S. Appl. No. 15/093,272, First Office Action dated Jan. 23, 2017, 19 pages.

Peddeti, U.S. Appl. No. 15/093,272, Final Office Action dated Apr. 26, 2017, 16 pages.

Zang et al., U.S. Appl. No. 15/093,292, First Office Action dated May 17, 2017, 4 pages.

Peddeti et al., U.S. Appl. No. 15/725,109, filed Oct. 4, 2017, entitled "Oxidizing Filler Material Lines to Increase Width of Hard Mask Lines" and Preliminary Amendment of Oct. 4, 2017.

* cited by examiner

OXIDIZING AND ETCHING OF MATERIAL LINES FOR USE IN INCREASING OR DECREASING CRITICAL DIMENSIONS OF HARD MASK LINES

TECHNICAL FIELD

The present disclosure generally relates to semiconductor fabrication, and more particularly, to method for use in semiconductor fabrication, for example, oxidizing and etching of material lines to increase or decrease corresponding critical dimensions of hard mask lines.

BACKGROUND OF THE DISCLOSURE

With CMOS technology entering FinFET in 14 nanometers (nm), conventional lithography is no longer capable for patterning fine pitches. The self-align-dual-patterning (SADP), self-aligned quadruple patterning (SAQP), or sidewall image transfer (SIT) process enables the small pitch patterning in forming Fins, gates, or even in BEOL (Back-End-Of-The-Line) metal connections at 7 nanometers node and beyond. Spacer defined lithography (SIT) only offers one CD (critical dimension) such as widths for fine lines.

SUMMARY OF THE DISCLOSURE

Shortcomings of the prior art are overcome and additional advantages are provided through the provision, in one embodiment, of a method which includes, for example, providing a starting semiconductor structure having a plurality of material lines disposed over a hard mask, and the hard mask disposed over a patternable layer, forming a protective layer over a portion of at least one material line, the at least one protected material line and at least one unprotected material line having a same critical dimension, oxidizing the at least one unprotected material line to increase the critical dimension compared to the first critical dimension of the at least one protected material line, and etching at least a portion of the oxidized unprotected material line so that the etched critical dimension of the at least one etched material line is different from the first critical dimension of the at least one protected material line.

In another embodiment, a method is provided. The method includes, for example, providing a starting semiconductor structure having a plurality of material lines disposed over a hard mask, and the hard mask disposed over a patternable layer, oxidizing the plurality of material lines, forming a protective layer over at least one of the plurality of oxidized material lines, the at least one protected oxidized material line and at least one unprotected oxidized material line having a same critical dimension, and etching at least a portion of the oxidized unprotected material line so that the etched critical dimension of the at least one etched material line is different from the first critical dimension of the at least one protected material line.

In another embodiment, an intermediate semiconductor structure is provided. The intermediate semiconductor structure includes, for example, a first plurality of material lines and a second plurality of material lines disposed over a hard mask, the hard mask disposed over a patternable layer, and the patentable layer disposed over a bulk semiconductor substrate. The second plurality of material lines includes etched oxide or having oxide removed. The first plurality of material lines having first critical dimension and the second plurality of material lines having a corresponding second critical dimension. The first critical dimension is different from the second critical dimension.

Additional features and advantages are realized through the techniques of the present disclosure. Other embodiments and aspects of the present disclosure are described in detail herein and are considered a part of the claims.

BRIEF DESCRIPTION OF THE DRAWINGS

The subject matter of the present disclosure is particularly pointed out and distinctly claimed in the concluding portion of the specification. The disclosure, however, may best be understood by reference to the following detailed description of various embodiments and the accompanying drawings in which:

DETAILED DESCRIPTION OF THE DISCLOSURE

Aspects of the present disclosure and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the disclosure in detail. It should be understood, however, that the detailed description and the specific examples, while indicating embodiments of the present disclosure, are given by way of illustration only, and are not by way of limitation. Various substitutions, modifications, additions and/or arrangements within the spirit and/or scope of the underlying concepts will be apparent to those skilled in the art from this disclosure. Reference is made below to the drawings, which are not drawn to scale for ease of understanding, wherein the same reference numbers used throughout different figures designate the same or similar components.

The present disclosure is directed to self-align-dual-patterning (SADP), sidewall image transfer (SIT), and self-aligned quadruple patterning (SAQP) processes with selective multi-CD (critical dimension) patterning capability by selectively fine tuning the spacer CD using a combination of oxidation or partial oxidation and wet/dry oxide etching or partial wet/dry oxide etching. The present disclosure may be advantageous for fine tuning CD of multi-fin fin widths or multi-channel lengths (for multi-Vt scheme), multi-gate widths or multi-gate channel lengths (for SOC), and/or BEOL metal connections with minimum extra masking steps without selectively performing an entire SADP or SAQP process.

Figure 1:
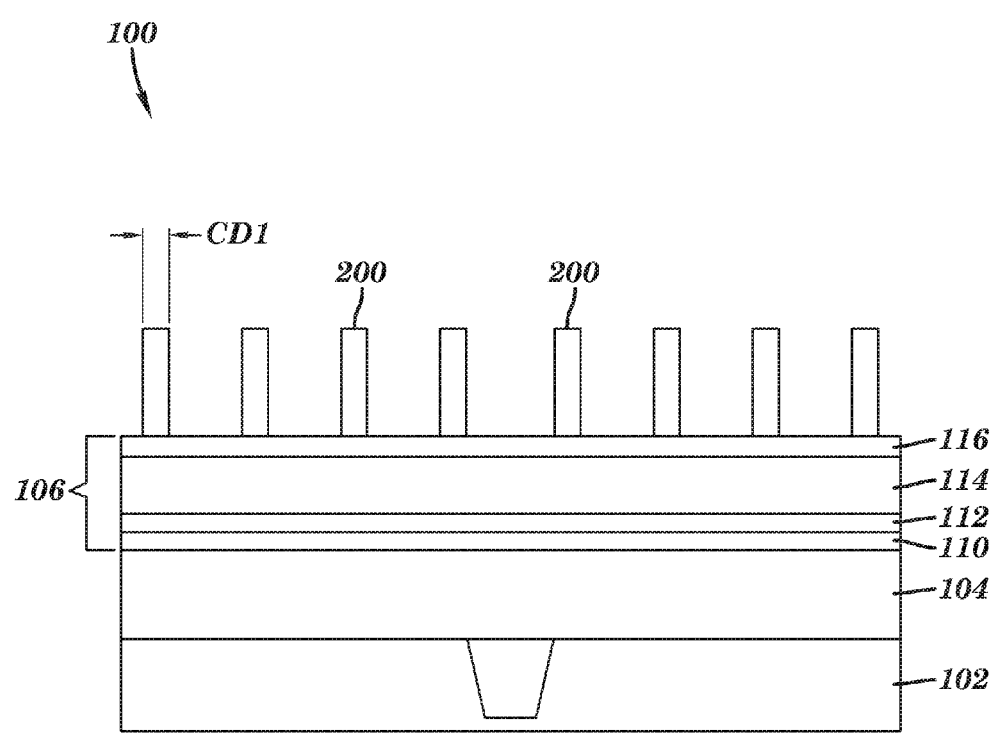
FIG. 1 is a cross-sectional view of a starting semiconductor structure according to an embodiment of the present disclosure.

FIG. 1 illustrates a cross-sectional view of a starting semiconductor structure 100 having a bulk semiconductor substrate 102 such as silicon, a patternable layer 104 such as polysilicon above the semiconductor substrate, a hard mask layer 106 over the patternable layer and a plurality of material lines 200 such as amorphous silicon or polysilicon over the hard mask layers according to an embodiment of the present disclosure. For example, hard mask layer 106 may include a stack of a silicon nitride layer 110, an oxide layer 112, a silicon nitride layer 114, and a low-k dielectric layer 116.

In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

Starting semiconductor structure 100 may be conventionally fabricated, for example, using known processes and techniques. An initial structure may include of bulk semiconductor substrate 102, patternable layer 104, and a hard mask layer 106, and subjected to a self-align-dual-patterning (SADP) or self-aligned quadruple patterning (SAQP) process. For example, an oxide or amorphous carbon layer may be deposited on hard mask layer 106. The oxide or amorphous carbon layer may then patterned and operably etched to form patterned mandrels. A layer of amorphous silicon or polysilicon may be deposed over the patterned mandrels, and an etching process employed to form vertical spacers on mandrel. Removal or stripping back the mandrel results in the spacers forming the plurality of material lines 200 shown in FIG. 1. For example, material lines 200 may be disposed at the same pitch and may have a similar critical dimension CD1.

FIGS. 2-7 illustrate a process for use in semiconductor fabrication having different corresponding critical dimensions according to an embodiment of the present disclosure. For example, a critical dimension of initially fabricated material lines may be reduced to have a smaller corresponding critical dimension.

Figure 2:
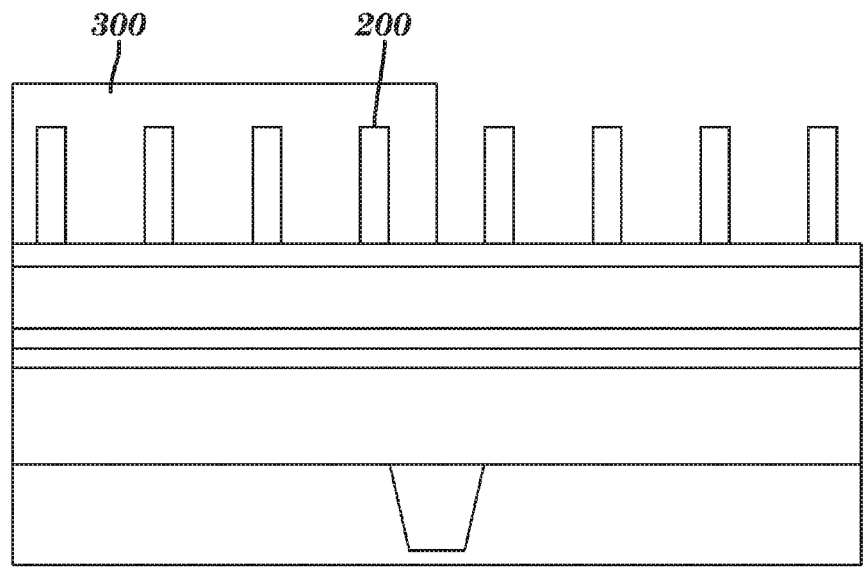
FIGS. 2-7 are cross-sectional views of a method for forming intermediate semiconductor structures having a hard mask lines having different corresponding critical dimensions according to an embodiment of the present disclosure.

Initially, as shown in FIG. 2, a patterned protective layer 300 is disposed over one or more of material lines 200. For example, patterned protective layer 300 may be formed using a lithographic and masking process.

Figure 3:
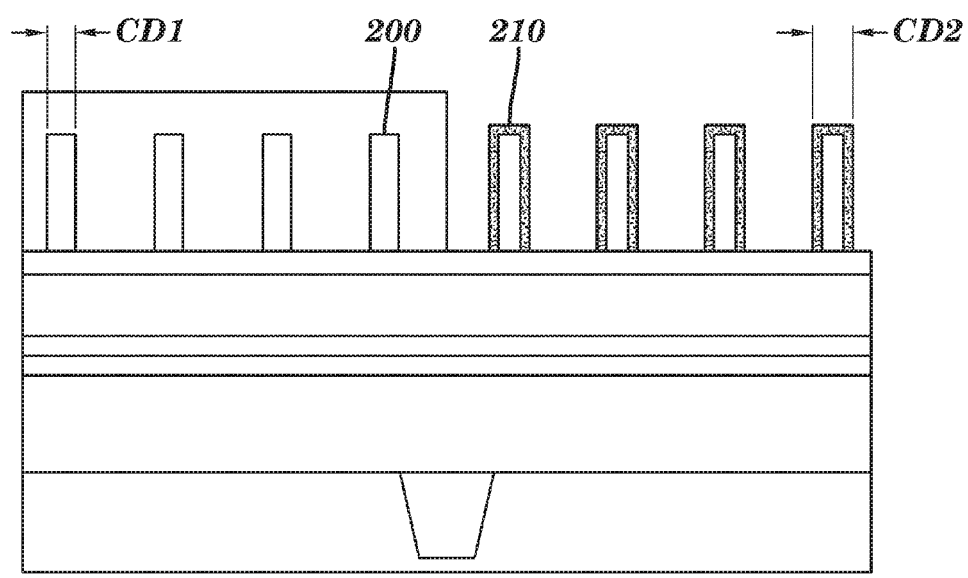

With reference to FIG. 3, an oxidation process such as at a low temperature is performed on the structure of FIG. 2 so that a partial oxide surrounds the unprotected material lines. Due to the oxidation process, the partially oxidized unprotected material lines 210 have a critical dimension CD2 greater than a critical dimension CD1 (FIGS. 1 and 3) of protected material lines 200.

Figure 4:
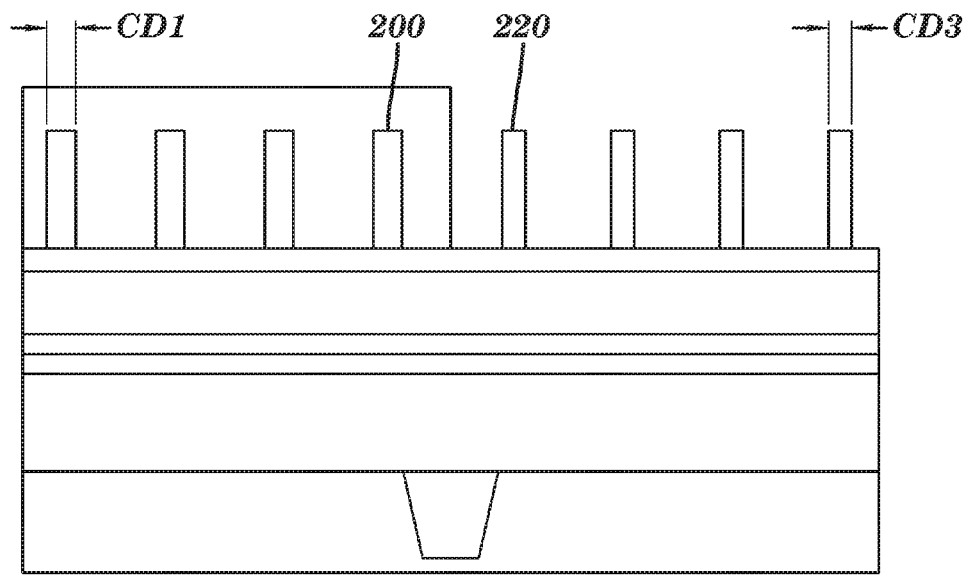

An etching process is performed on the structure of FIG. 3 to fully remove the oxide portions as shown in FIG. 4. The oxide etching may be a wet oxide etching or a dry oxide etching. For example, a wet oxide etching may be employed using, e.g., a HF acid. A dry oxide etching may include a SiCoNi etch. The etching process may result in resulting material lines 220 having a critical dimension CD3 which is less than critical dimension CD1 of protected material lines 200. Critical dimensions CD3 and CD1 may be about 3 nanometers to about 18 nanometers. Critical dimensions CD3 and CD1 may be less than about 10 nanometers.

Figure 5:
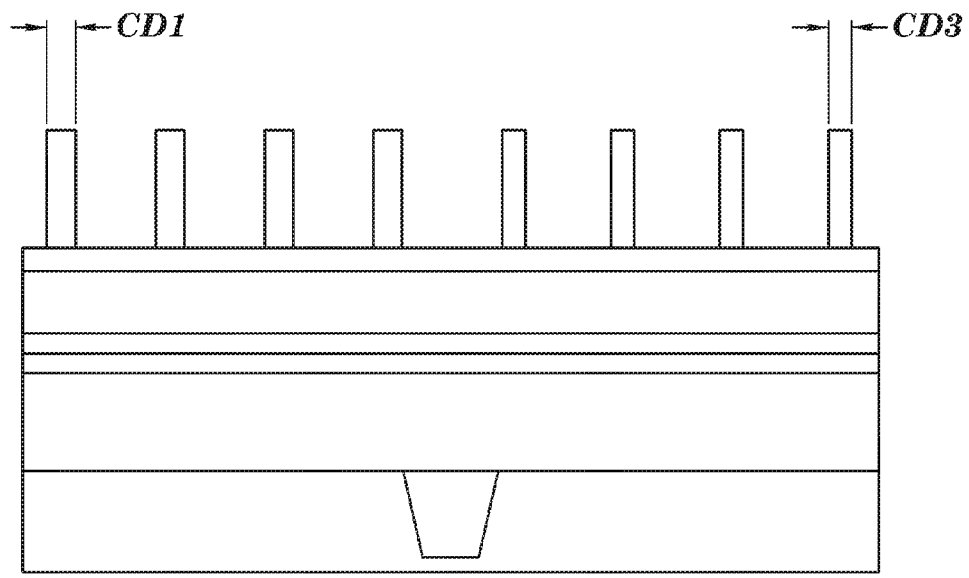

Patterned protective layer 300 is removed as shown in FIG. 5 resulting in the material lines having different corresponding size critical dimensions. For example, the patterned protective layer may be removed by a wet or plasma N2/H2 ashing (non-oxidizing) process.

The different corresponding sized critical dimensions of the material lines are used for pattern transfer to the underlying layers. An etching process is employed on the resulting structure of FIG. 5 resulting in patterning of hard masks shown in FIGS. 6 and 7. After removal of the first hard mask (FIG. 6), resulting final patterned hard masks (FIG. 7) may be used for patterning the patternable layer 104 and also the bulk semiconductor substrate 102 for forming multiple fins having different critical dimensions, e.g., widths or lengths (where the substrate is silicon). If the underlying layer is amorphous silicon (as dummy gate) and to be patterned with different critical dimensions, e.g., widths or lengths, then a similar method can be performed.

FIGS. 8-11 illustrate a process for use in semiconductor fabrication having different corresponding critical dimensions according to an embodiment of the present disclosure. For example, a critical dimension of initially fabricated material lines may be reduced to have a smaller corresponding critical dimension.

Figure 8:
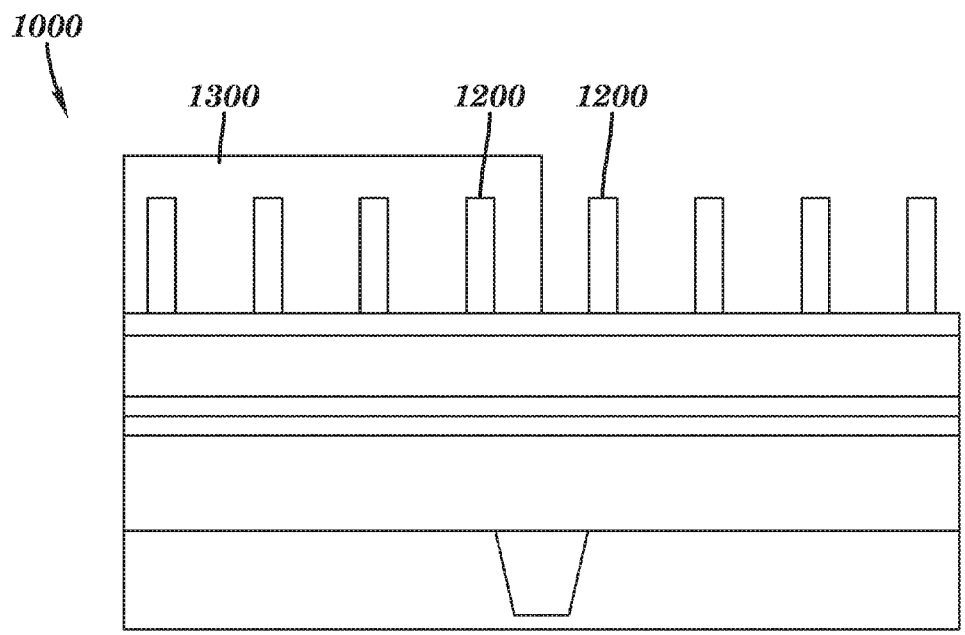
FIGS. 8-11 are cross-sectional views of a method for use in forming intermediate semiconductor structures having a hard mask lines having different critical dimensions according to an embodiment of the present disclosure.

Initially, as shown in FIG. 8, a starting semiconductor structure 1000 may be similar to starting semiconductor structure 100 (FIG. 1). For example, starting semiconductor structure 1000 may include a bulk semiconductor substrate such as silicon, a first material layer such as polysilicon above the semiconductor substrate, a hard mask layer over the first patternable layer and a plurality of material lines 1200 such as amorphous silicon or polysilicon over the hard mask layers according to an embodiment of the present disclosure. A patterned protective layer 1300 is disposed over one or more of material lines 1200. For example, patterned protective layer 1300 may be formed using a lithographic and masking process.

Figure 9:
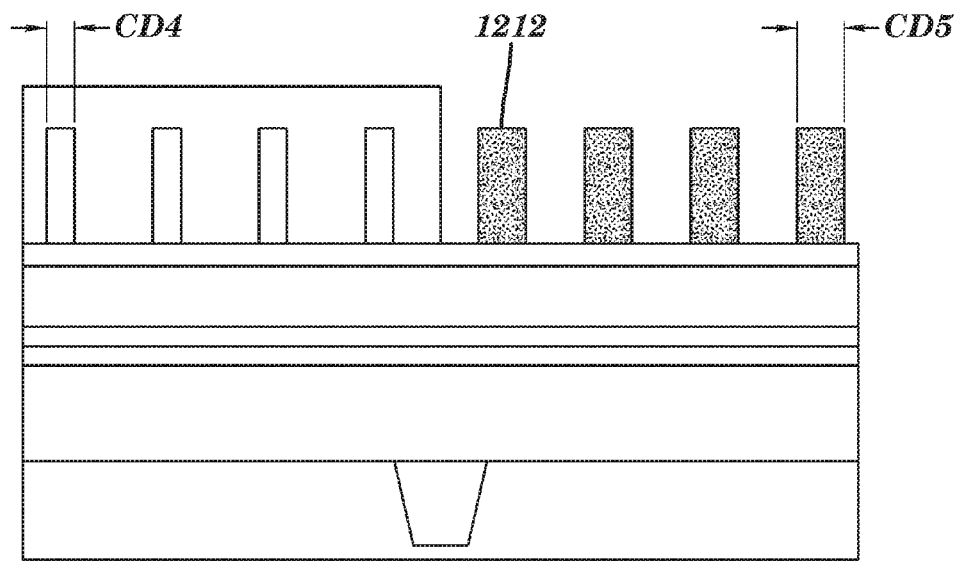

With reference to FIG. 9, an oxidation process such as at a low temperature is performed on the structure of FIG. 8 so that the unprotected material lines are fully oxidized. Due to the oxidation process, the fully oxidized unprotected material lines 1212 have a critical dimension CD5 (FIG. 9) greater than a critical dimension CD4 (FIG. 9) of protected material lines 1200. Critical dimension CD4 may be up to about 40 percent greater, e.g., Si being oxidized to SiO2. Critical dimensions CD5 and CD4 may be less than about 10 nanometers.

Figure 10:
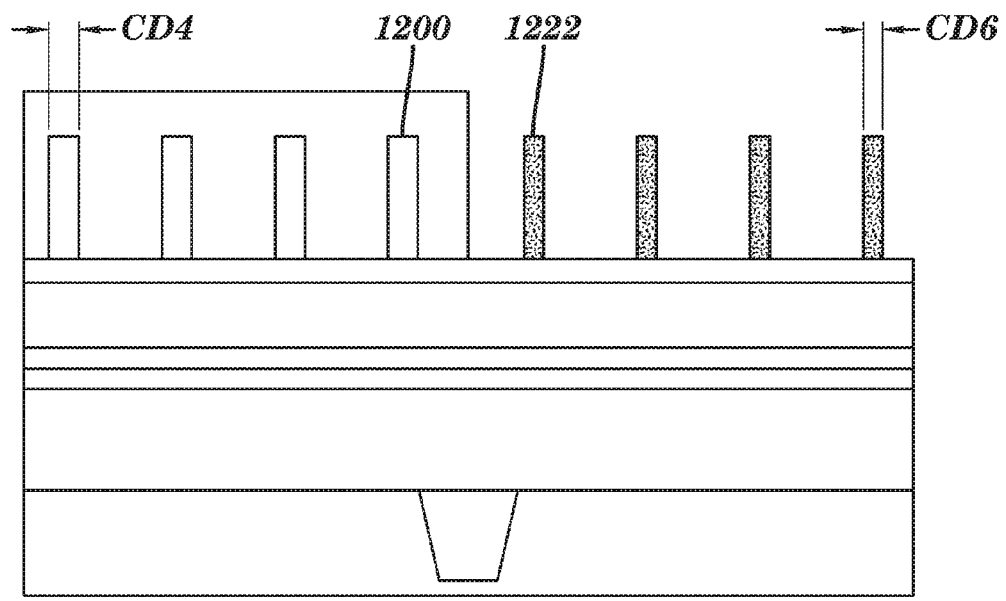

An etching process is performed on the structure of FIG. 9 to partially remove the oxide portion as shown in FIG. 10. The oxide etching may be a wet oxide etching or a dry oxide etching. For example, a wet oxide etching may be employed using, e.g., a HF acid. A dry oxide etching may include a SiCoNi etch. The etching process may result in material lines 1222 having a critical dimension CD6, which as shown in FIG. 10, is less than the critical dimension CD4 of protected material lines 1200. Critical dimensions CD6 and CD4 may be about 3 nanometers to about 18 nanometers. Critical dimensions CD6 and CD4 may be less than about 10 nanometers.

Figure 11:
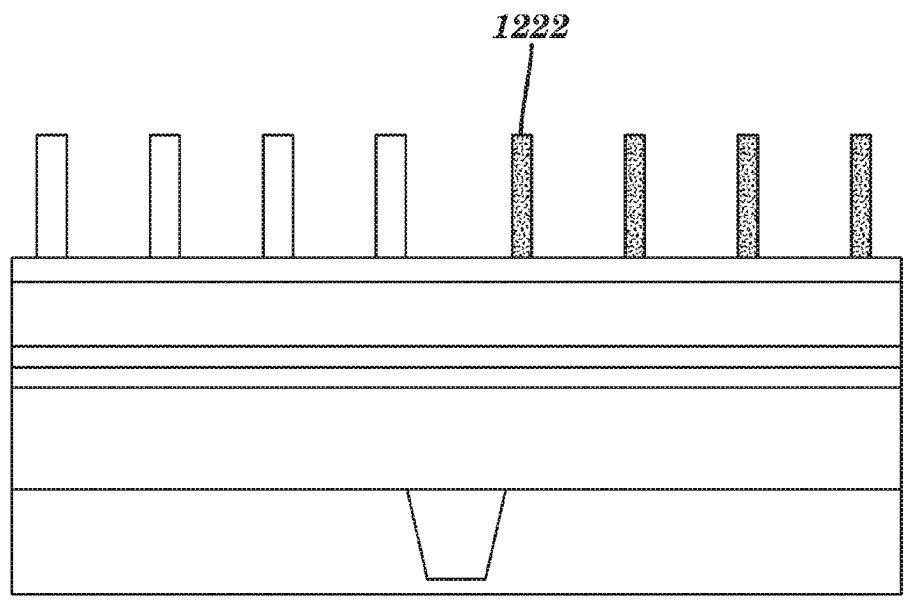

Patterned protective layer 1300 is removed as shown in FIG. 11 resulting in the material lines having different corresponding sized critical dimensions. For example, the patterned protective layer may be removed by a wet or plasma N2/H2 ashing (non-oxidizing) process. Material lines 1222 may be adjusted such as thinned down about 1 nanometer to 2 nanometers by a SiCoNi process (oxide etching) if desired.

Figure 6:
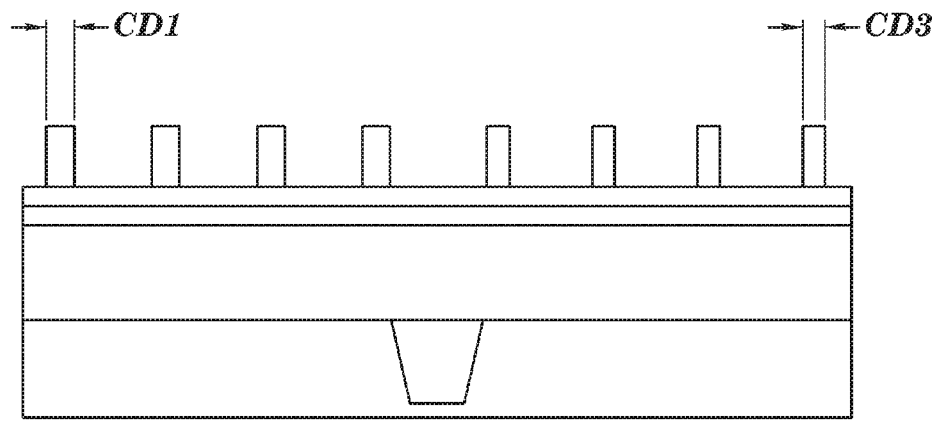
Figure 7:
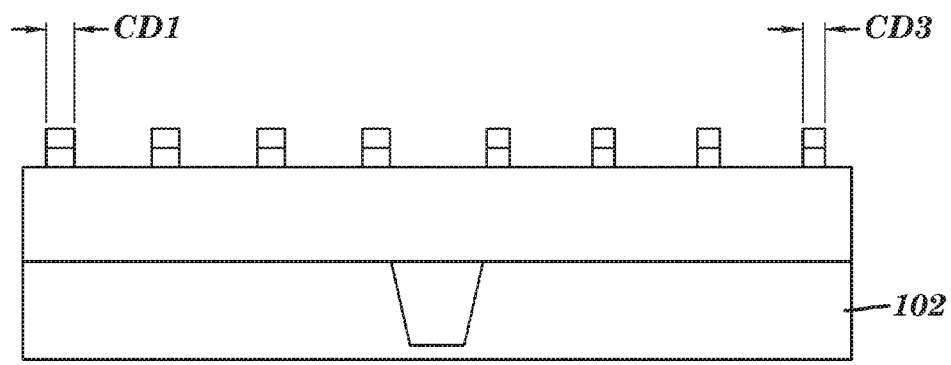

The different corresponding sized critical dimensions of the material lines are used for pattern transfer to the underlying layers. An etching process is employed on the resulting structure of FIG. 11 resulting in a similar patterning of hard masks (e.g., as shown in FIGS. 6 and 7), which resulting hard masks may be used in for patterning of the bulk semiconductor substrate for forming multiple fins having different critical dimensions, e.g., widths or lengths (where the substrate is silicon). If the underlying layer under the hard mask is amorphous silicon (as dummy gate) and to be patterned with multiple different critical dimensions, e.g., widths or lengths then the same steps can be performed.

Figure 12:
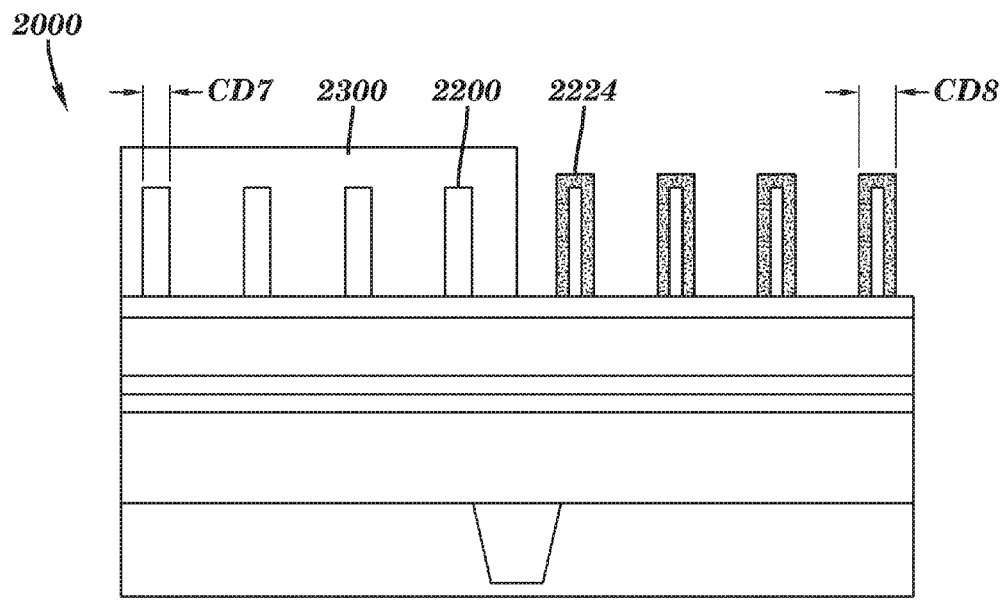
FIGS. 12-13 are cross-sectional views of a process for use in forming intermediate semiconductor structures having a hard mask lines having different corresponding critical dimensions.
Figure 13:
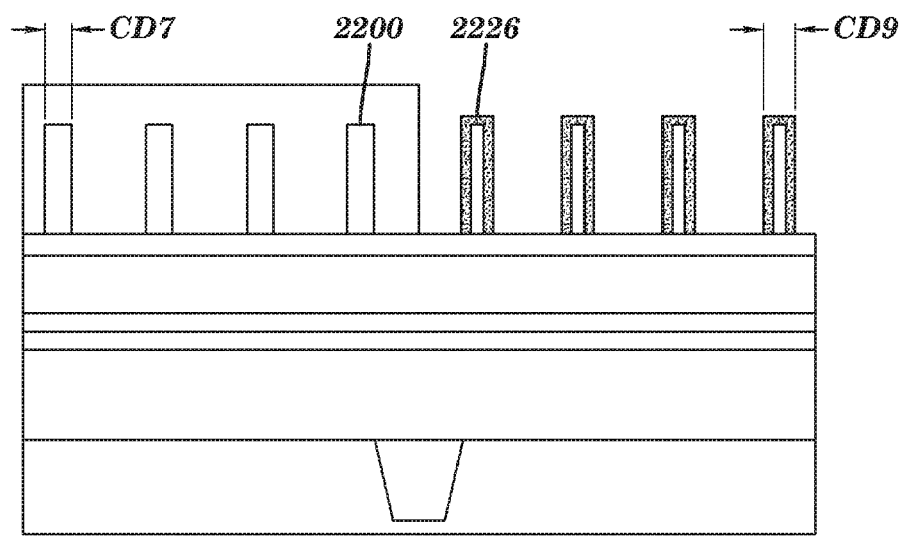

FIGS. 12 and 13 illustrate a process for use in semiconductor fabrication having different corresponding critical dimensions according to an embodiment of the present disclosure. For example, a critical dimension of initially fabricated material lines may be increased to have a larger corresponding critical dimension.

Initially, as shown in FIG. 12, a starting semiconductor structure 2000 may be similar to starting semiconductor structure 100 (FIG. 1). For example, the starting semiconductor structure may include a bulk semiconductor substrate such as silicon, a first material layer such as polysilicon above the semiconductor substrate, a hard mask layers over the first material layer and a plurality of material lines 2200 such as amorphous silicon or polysilicon over the hard mask layers according to an embodiment of the present disclosure. A patterned protective layer 2300 is disposed over one or more of material lines 2200. For example, patterned protective layer 2300 may be formed using a lithographic and masking process.

An oxidation process such as at a low temperature is performed on the structure of FIG. 12 so that the unprotected material lines are partially oxidized. Due to the oxidation process, the partially oxidized unprotected material line 2224 have a critical dimension CD8 which is greater than a critical dimension CD7 of protected material lines 2200.

An oxide etching process is performed on the structure of FIG. 12 to partially remove the oxide portions as shown in FIG. 13. The oxide etching may be a wet oxide etching or a dry oxide etching. For example, a wet oxide etching may be employed using, e.g., a HF acid. A dry oxide etching may include a SiCoNi etch. The etching process may result in resulting material lines 2226 having a critical dimension CD9, which as shown in FIG. 13, is greater than the critical dimension CD7 of protected material lines 2200. Critical dimensions CD9 and CD7 may be about 3 nanometers to about 18 nanometers. Critical dimensions CD9 and CD7 may be less than about 10 nanometers.

Patterned protective layer 2300 may be removed resulting in the material lines having different corresponding size critical dimensions. For example, the patterned protective layer may be removed by a wet or plasma N2/H2 ashing (non-oxidizing) process. Material lines 2226 may be adjusted such as thinned down about 1 nanometer to 2 nanometers by a SiCoNi process (oxide etching) if desired.

The different corresponding sized critical dimensions of the material lines are used for pattern transfer to the underlying layers. An etching process may be employed on the resulting structure resulting in a patterning of hard masks, which resulting hard masks may be used in for patterning of the bulk semiconductor substrate for forming multiple fins having different critical dimensions, e.g., widths or lengths (where the substrate is silicon). If the underlying layer under the hard mask is amorphous silicon (as dummy gate) and to be patterned with multiple dummy gates having different critical dimensions, then the same steps can be performed.

Figure 14:
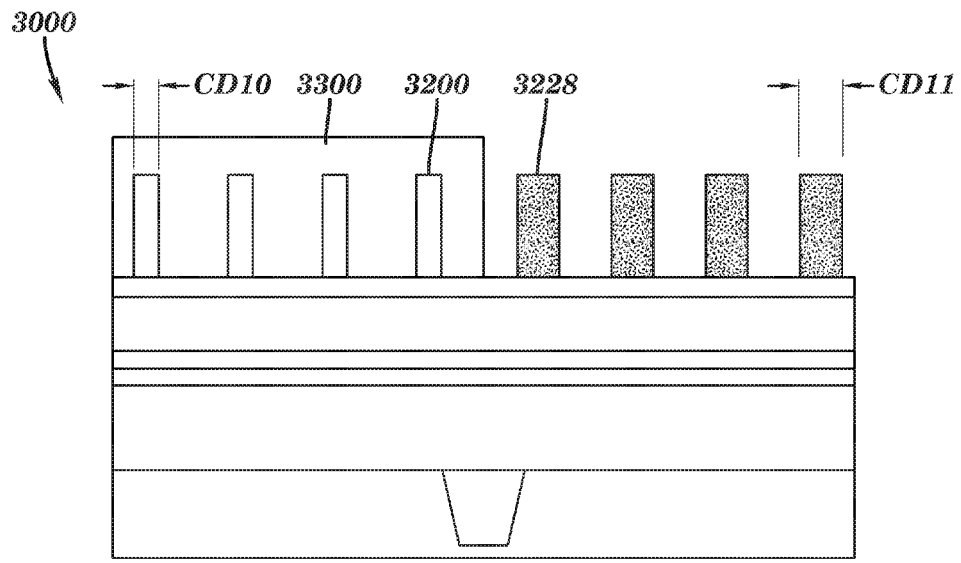
FIGS. 14-15 are cross-sectional views of a process for use in forming intermediate semiconductor structures having a hard mask lines having different corresponding critical dimensions.
Figure 15:
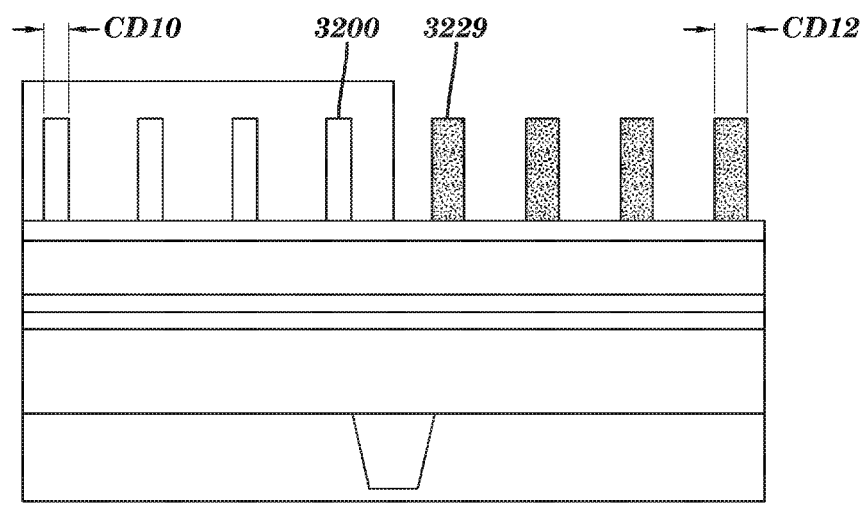

FIGS. 14 and 15 illustrate a process for use in semiconductor fabrication having different corresponding critical dimensions according to an embodiment of the present disclosure. For example, a critical dimension of initially fabricated material lines may be increased to have a larger corresponding critical dimension.

Initially, as shown in FIG. 14, a starting semiconductor structure 3000 may be similar to starting semiconductor structure 100 (FIG. 1). For example, the starting semiconductor structure may include a bulk semiconductor substrate such as silicon, a first material layer such as polysilicon above the semiconductor substrate, a hard mask layers over the first material layer and a plurality of material lines 3200 such as amorphous silicon or polysilicon over the hard mask layers according to an embodiment of the present disclosure. A patterned protective layer 3300 is disposed over one or more of material lines 3200. For example, patterned protective layer 3300 may be formed using a lithographic and masking process.

An oxidation process such as at a low temperature is performed on the structure of FIG. 14 so that the unprotected material lines are fully oxidized. Due to the oxidation process, the fully oxidized unprotected material line 3228 have a critical dimension CD11 which is greater than a critical dimension CD10 of protected material lines 3200.

An oxide etching process is performed on the structure of FIG. 14 to partially remove the oxide portions as shown in FIG. 15. The oxide etching may be a wet oxide etching or a dry oxide etching. For example, a wet oxide etching may be employed using, e.g., a HF acid. A dry oxide etching may include a SiCoNi etch. The etching process may result in resulting material lines 3229 having a critical dimension CD12, which as shown in FIG. 15, is greater than the critical dimension CD10 of protected material lines 3200. Critical dimensions CD12 and CD10 may be about 3 nanometers to about 18 nanometers. Critical dimensions CD12 and CD10 may be less than about 10 nanometers.

Patterned protective layer 3300 may be removed resulting in material lines having different corresponding size critical dimensions. For example, the patterned protective layer may be removed by a wet or plasma N2/H2 ashing (non-oxidizing) process. Material lines 3229 may be adjusted further such as thinned down about 1 nanometer to 2 nanometers by a SiCoNi process (oxide etching by plasma) if desired.

The different corresponding sized critical dimensions of the material lines are used for pattern transfer to the underlying layers. An etching process may be employed on the resulting structure resulting in a patterning of hard masks, which resulting hard masks may be used in for patterning of bulk semiconductor substrate 102 for forming multiple fins having different critical dimensions, e.g., widths or lengths (where the substrate is silicon). If the underlying layer under the hard mask is amorphous silicon (as dummy gate) and to be patterned with multiple dummy gates having different critical dimensions, e.g., widths or lengths then the same steps can be performed.

From the present disclosure, it will be appreciated that the processes described above may be employed with multiple applications and removal of protective patterning, fully and/or partial oxidation, and fully and partial etching of oxidation portions, resulting in multiple material lines having multiple different corresponding critical dimensions. Such a process allows for forming and tailoring multiple fins (e.g., where the substrate is silicon) with different widths or channel lengths, or multiple dummy gates (e.g., where the substrate is amorphous silicon) with different widths or channel lengths.

Figure 16:
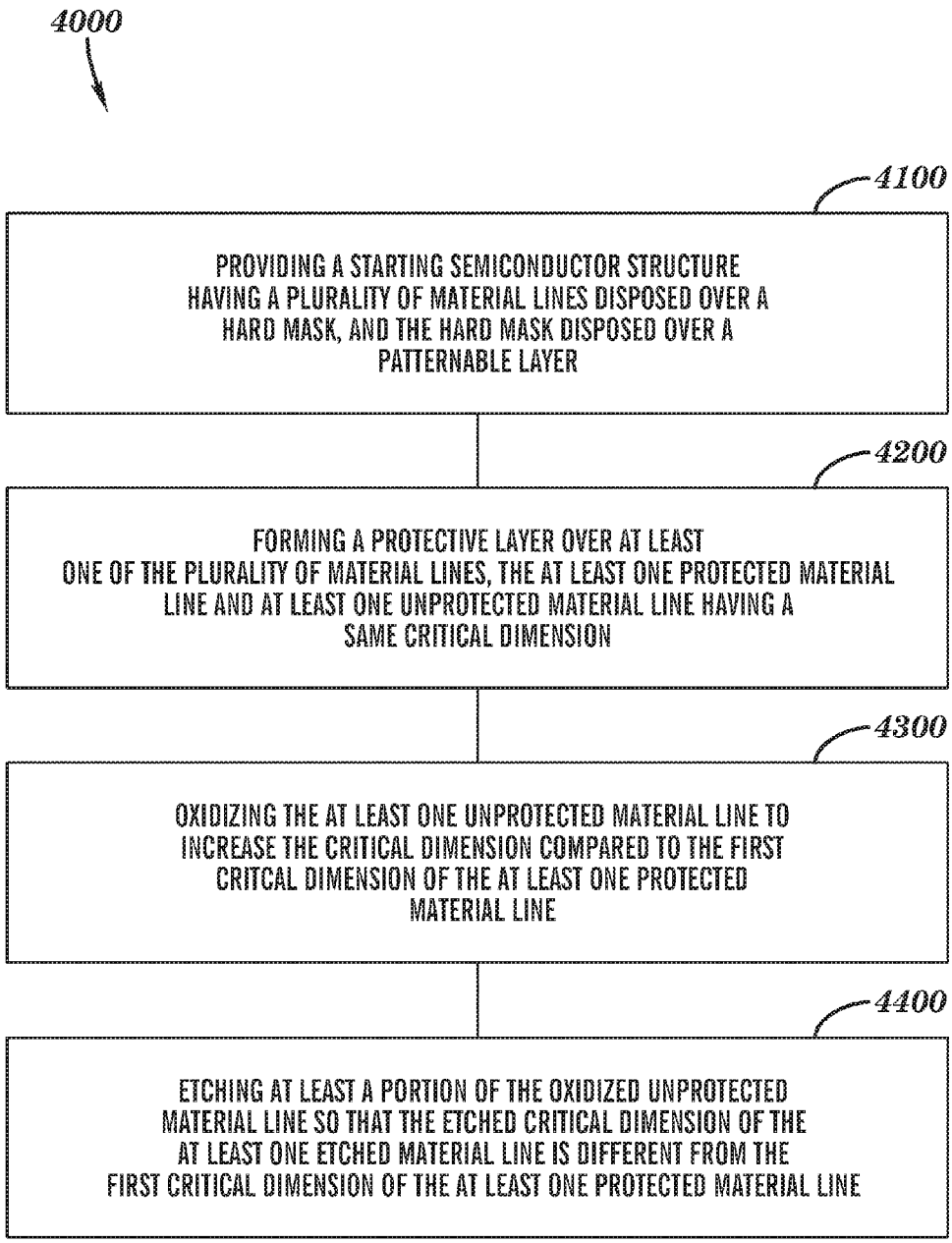
FIG. 16 is a flowchart illustrating a method according to an embodiment of the present disclosure.

FIG. 16 is a flowchart of a method 4000 according to an embodiment of the present disclosure. Method 4000 includes, for example, at 4100 providing a starting semiconductor structure having a plurality of material lines disposed over a hard mask, and the hard mask disposed over a patternable layer, at 4200 forming a protective layer over at least one of the plurality of material lines, the at least one protected material line and at least one unprotected material line having a same critical dimension, at 4300 oxidizing the at least one unprotected material line to increase the critical dimension compared to the first critical dimension of the at least one protected material line, and at 440 etching at least a portion of the oxidized unprotected material line so that the etched critical dimension of the at least one etched material line is different from the first critical dimension of the at least one protected material line.

FIGS. 17-20 illustrate a process for use in semiconductor fabrication having different corresponding critical dimensions according to an embodiment of the present disclosure. For example, a critical dimension of initially fabricated material lines may be reduced to have a smaller corresponding critical dimension. In this illustrated example, a patterning layer may be disposed on a plurality of fully oxidized material lines.

Figure 17:
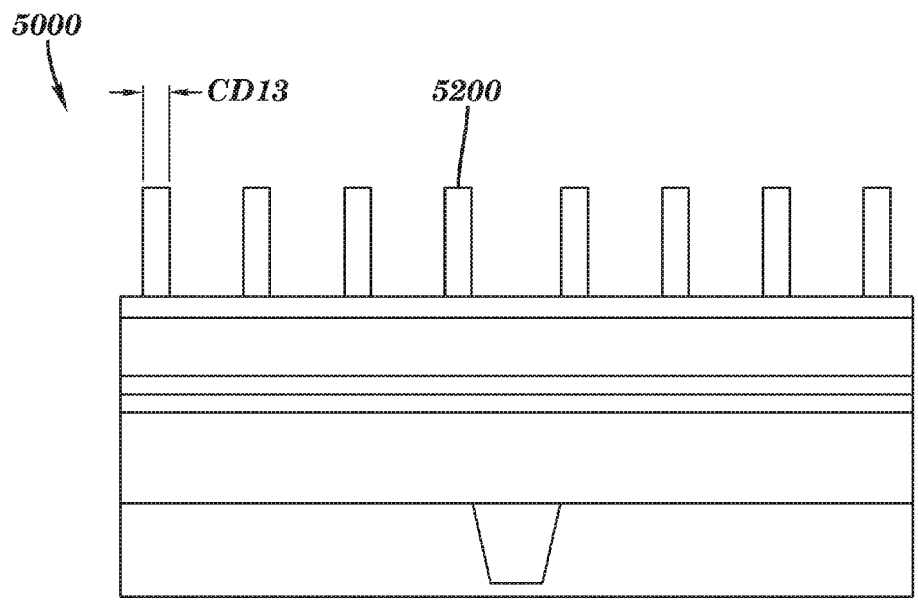
FIGS. 17-20 are cross-sectional views of a process for use in forming intermediate semiconductor structures having a hard mask lines having different corresponding critical dimensions.

Initially, as shown in FIG. 17, a starting semiconductor structure 5000 may be similar to starting semiconductor structure 100 (FIG. 1). For example, starting semiconductor structure 5000 may include a bulk semiconductor substrate such as silicon, a first material layer such as polysilicon above the semiconductor substrate, a hard mask layer over the first patternable layer and a plurality of material lines 5200 such as amorphous silicon or polysilicon over the hard mask layers according to an embodiment of the present disclosure.

Figure 18:
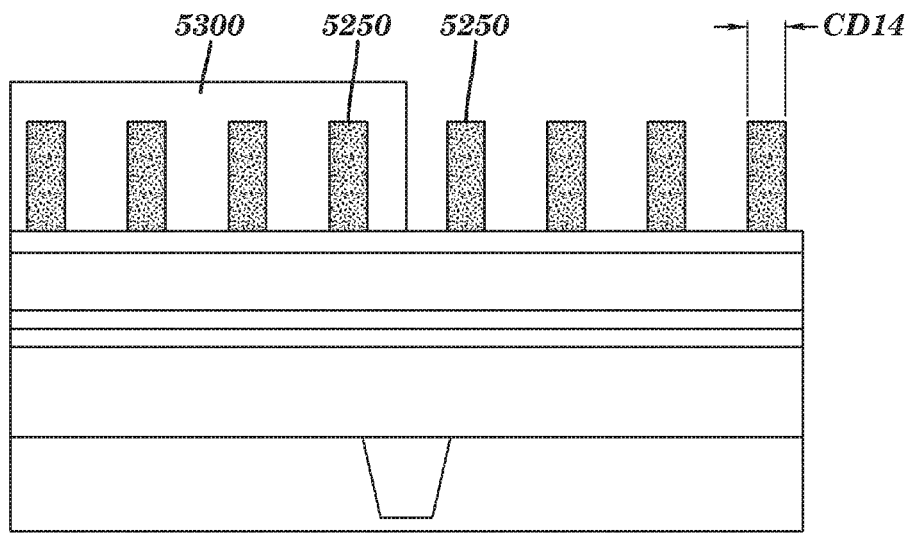

An oxidation process such as at a low temperature is performed on the structure of FIG. 17 so that material lines 5250 are fully oxidized as shown in FIG. 18. Thereafter, a patterned protective layer 5300 is disposed over one or more of the fully oxidized material lines 5250. For example, patterned protective layer 5300 may be formed using a lithographic and masking process. Due to the oxidation process, the fully oxidized unprotected material lines 5250 have a critical dimension CD14 (FIG. 18) greater than a critical dimension CD13 (FIG. 17) of material lines 5200. Critical dimension CD14 may be up to about 40 percent greater, e.g., Si being oxidized to SiO2. Critical dimensions CD13 and CD14 may be about 3 nanometers to about 18 nanometers. Critical dimensions CD13 and CD14 may be less than about 10 nanometers.

Figure 19:
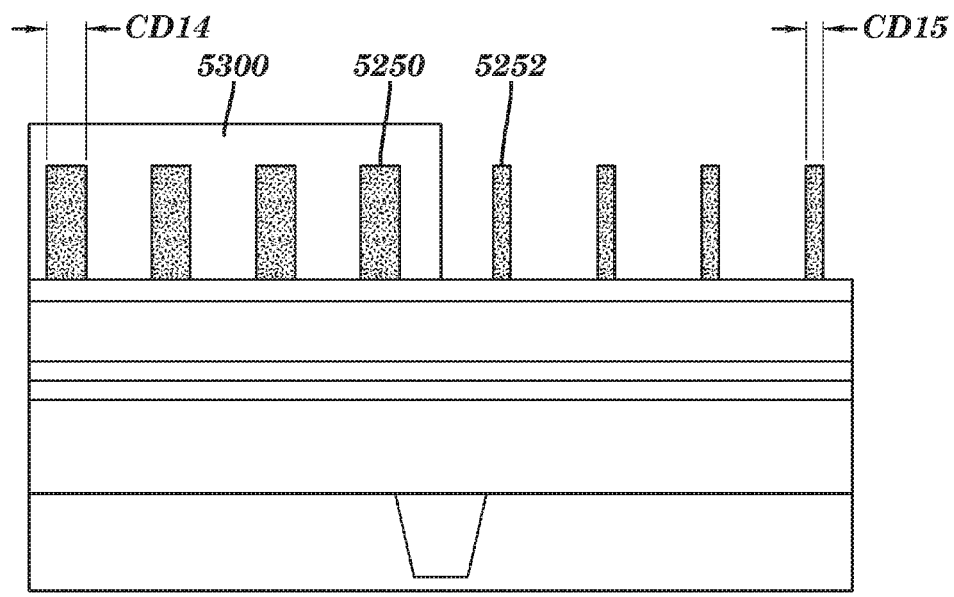

An etching process is performed on the structure of FIG. 18 to partially remove the oxide portion as shown in FIG. 19. The oxide etching may be a wet oxide etching or a dry oxide etching. For example, a wet oxide etching may be employed using, e.g., a HF acid. A dry oxide etching may include a SiCoNi etch. The etching process may result in material lines 5252 having a critical dimension CD15, which as shown in FIG. 19, is less than the critical dimension CD14 of protected material lines 5250. Critical dimension CD15 may be about 3 nanometers to about 18 nanometers. Critical dimension CD15 may be less than about 10 nanometers.

Figure 20:
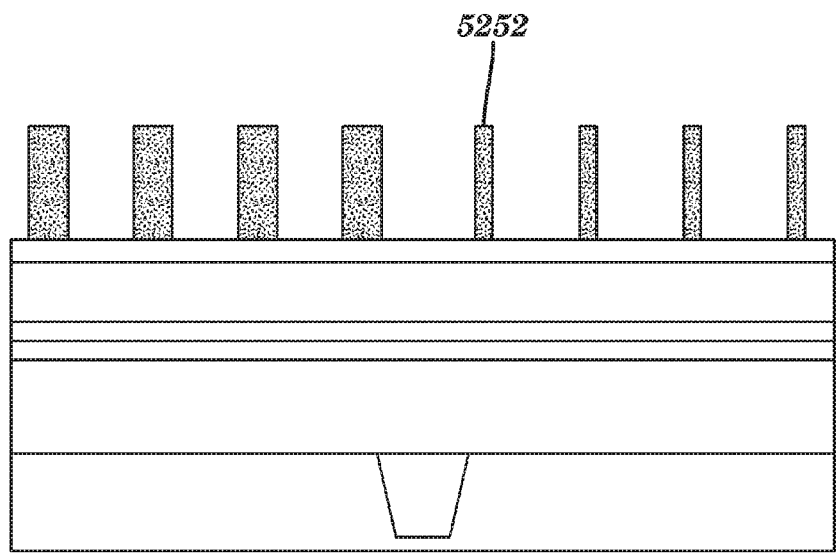

Patterned protective layer 5300 is removed as shown in FIG. 20 resulting in material lines having different corresponding sized critical dimensions. For example, the patterned protective layer may be removed by a wet or plasma N2/H2 ashing (non-oxidizing) process. Material lines 5252 may be adjusted such as thinned down about 1 nanometer to 2 nanometers by a SiCoNi process (oxide etching) if desired.

The different corresponding sized critical dimensions of the material lines are used for pattern transfer to the underlying layers. An etching process is employed on the resulting structure of FIG. 20 resulting in a similar patterning of hard masks (e.g., as shown in FIGS. 6 and 7), which resulting hard masks may be used in for patterning of the bulk semiconductor substrate for forming multiple fins having different critical dimensions, e.g., widths or lengths (where the substrate is silicon). If the underlying layer under the hard mask is amorphous silicon (as dummy gate) and to be patterned with multiple different critical dimensions, e.g., widths or lengths then the same steps can be performed.

FIGS. 21-24 illustrate a process for use in semiconductor fabrication having different corresponding critical dimensions according to an embodiment of the present disclosure. For example, a critical dimension of initially fabricated material lines may be reduced to have a smaller corresponding critical dimension. In this illustrated example, a patterning layer may be disposed on a plurality of partially oxidized material lines.

Figure 21:
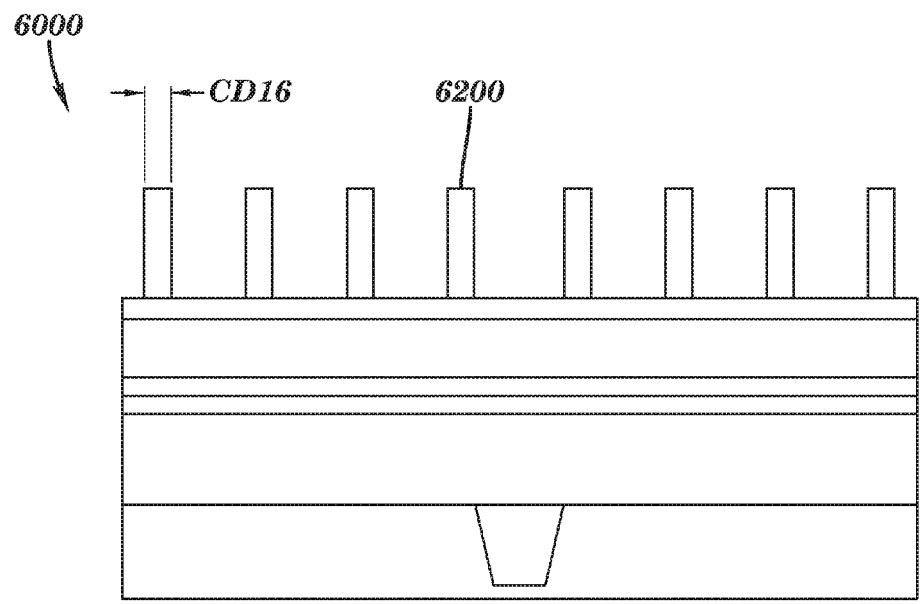
FIGS. 21-24 are cross-sectional views of a process for use in forming intermediate semiconductor structures having a hard mask lines having different corresponding critical dimensions.

Initially, as shown in FIG. 21, a starting semiconductor structure 6000 may be similar to starting semiconductor structure 100 (FIG. 1). For example, starting semiconductor structure 6000 may include a bulk semiconductor substrate such as silicon, a first material layer such as polysilicon above the semiconductor substrate, a hard mask layer over the first patternable layer and a plurality of material lines 6200 such as amorphous silicon or polysilicon over the hard mask layers according to an embodiment of the present disclosure.

Figure 22:
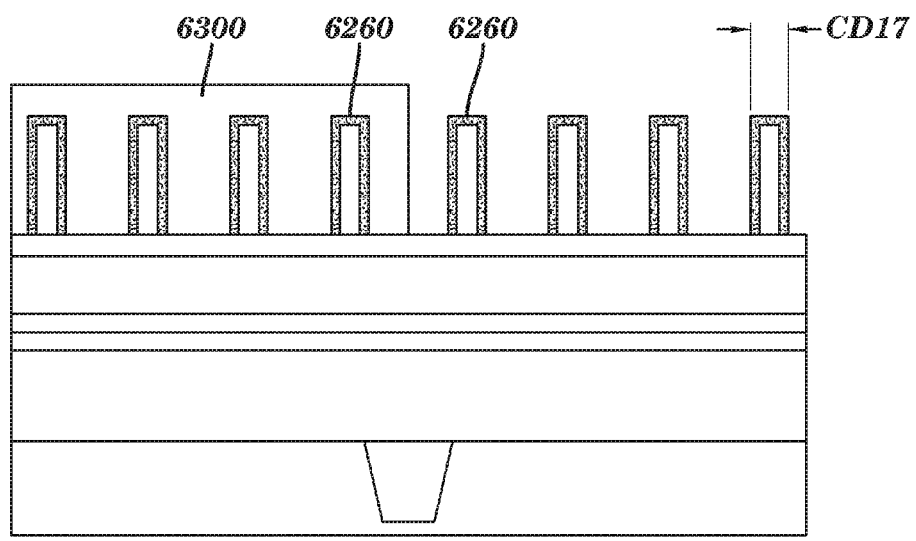

An oxidation process such as at a low temperature is performed on the structure of FIG. 21 so that material lines 6260 are partially oxidized as shown in FIG. 22. Thereafter, a patterned protective layer 6300 is disposed over one or more of the partially oxidized material lines 6260. For example, patterned protective layer 6300 may be formed using a lithographic and masking process. Due to the oxidation process, the partially oxidized unprotected material lines 6260 have a critical dimension CD17 (FIG. 22) greater than a critical dimension CD16 (FIG. 21) of material lines 5200. Critical dimensions CD16 and CD17 may be about 3 nanometers to about 18 nanometers. Critical dimensions CD16 and CD17 may be less than about 10 nanometers.

Figure 23:
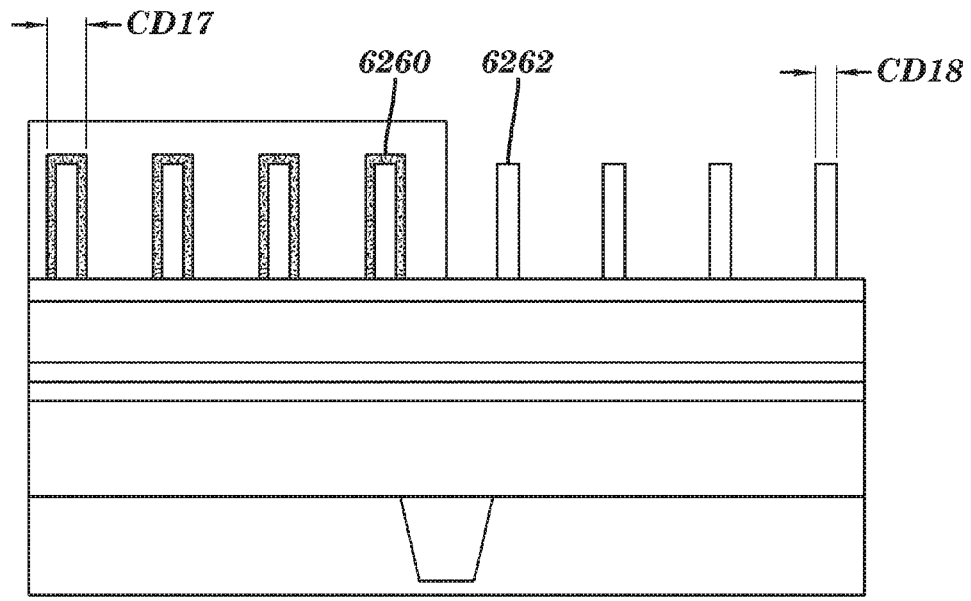
Figure 24:
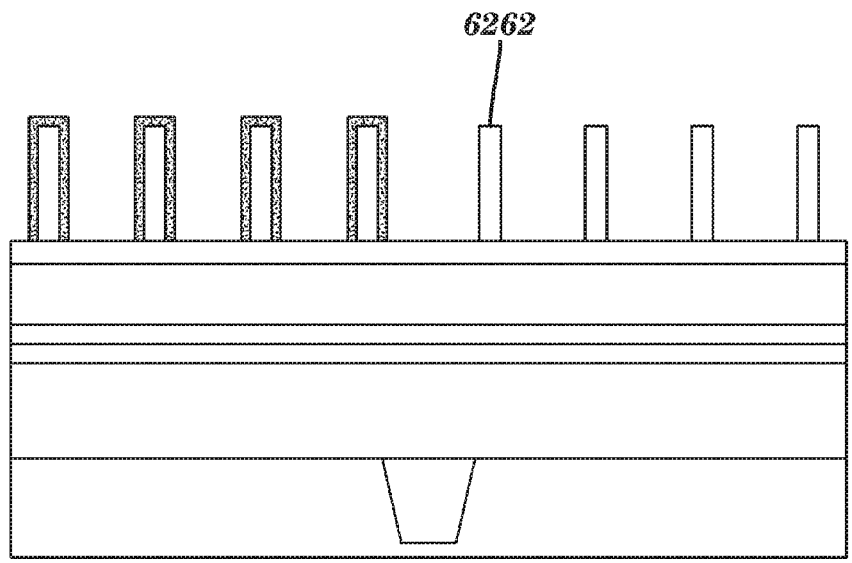

An etching process is performed on the structure of FIG. 22 to fully remove the oxide portion as shown in FIG. 24. The oxide etching may be a wet oxide etching or a dry oxide etching. For example, a wet oxide etching may be employed using, e.g., a HF acid. A dry oxide etching may include a SiCoNi etch. The etching process may result in material lines 6262 having a critical dimension CD18, which as shown in FIG. 23, is less than the critical dimension CD17 of protected material lines 6260. Critical dimension CD18 may be about 3 nanometers to about 18 nanometers. Critical dimension CD18 may be less than about 10 nanometers.

Patterned protective layer 6300 is removed as shown in FIG. 24 resulting in material lines having different corresponding sized critical dimensions. For example, the patterned protective layer may be removed by a wet or plasma N2/H2 ashing (non-oxidizing) process. Material lines 6262 may be adjusted such as thinned down about 1 nanometer to 2 nanometers by a SiCoNi process (oxide etching) if desired.

The different corresponding sized critical dimensions of the material lines are used for pattern transfer to the underlying layers. An etching process is employed on the resulting structure of FIG. 24 resulting in a similar patterning of hard masks (e.g., as shown in FIGS. 6 and 7), which resulting hard masks may be used in for patterning of the bulk semiconductor substrate for forming multiple fins having different critical dimensions, e.g., widths or lengths (where the substrate is silicon). If the underlying layer under the hard mask is amorphous silicon (as dummy gate) and to be patterned with multiple different critical dimensions, e.g., widths or lengths then the same steps can be performed.

Figure 25:
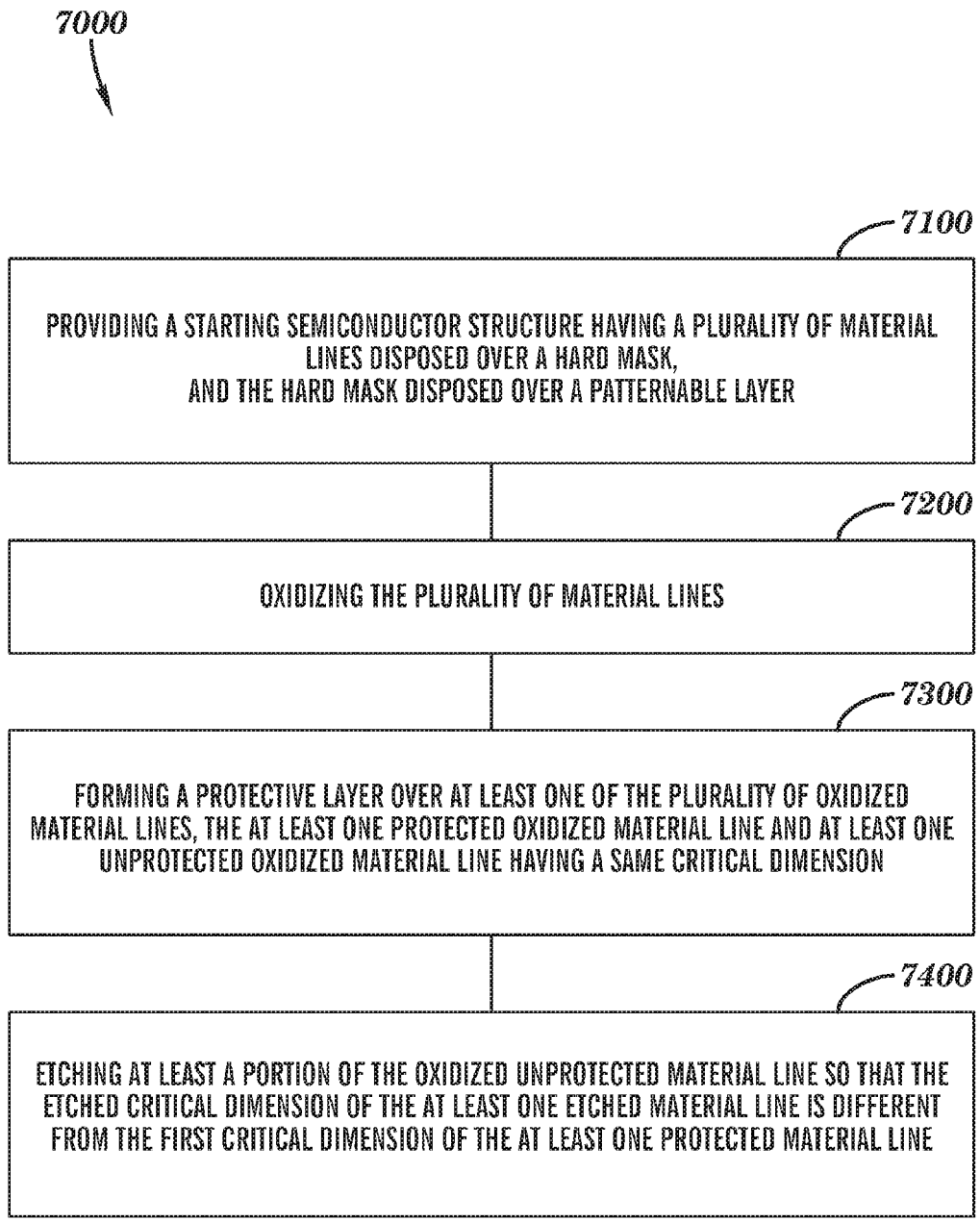
FIG. 25 is a flowchart illustrating a method according to an embodiment of the present disclosure.

FIG. 25 is a flowchart of a method 7000 according to an embodiment of the present disclosure. Method 7000 includes, for example, at 7100 providing a starting semiconductor structure having a plurality of material lines disposed over a hard mask, and the hard mask disposed over a patternable layer, at 7200 oxidizing the plurality of material lines, at 7300 forming a protective layer over at least one of the plurality of oxidized material lines, the at least one protected oxidized material line and at least one unprotected oxidized material line having a same critical dimension, and at 7400 etching at least a portion of the oxidized unprotected material line so that the etched critical dimension of the at least one etched material line is different from the first critical dimension of the at least one protected material line.

It will be appreciated from the present disclosure provides a new SADP method or SAQP method with selective multi-CD patterning capability (e.g., 1 extra mask for 2 CDs at the same pitch, 2 masking steps for 4 CDs at same pitch, etc.) by selectively fine tuning the spacer CD using oxidation or partial oxidation and wet/dry oxide etching. Then proceed with the rest of conventional SADP or SAQP steps by etching down and transfer pattern on under-layers (e.g. HM, Si, a-Si, oxide, etc). The present method can be used for forming fins with selective fin-width for multi-Vt scheme. The present method can also be used for forming multiple channel length without using critical multiple gate litho/etch steps.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of one or more aspects of the present disclosure and the practical application, and to enable others of ordinary skill in the art to understand one or more aspects of the disclosure for various embodiments with various modifications as are suited to the particular use contemplated.

The invention claimed is:

1. A method comprising:
    providing a starting semiconductor structure comprising a plurality of material lines disposed over a hard mask, and the hard mask disposed over a patternable layer;
    forming a protective layer over at least one of the plurality of material lines, the at least one protected material line and at least one unprotected material line having a same critical dimension;
    oxidizing the at least one unprotected material line to increase the critical dimension compared to the critical dimension of the at least one protected material line; and
    etching at least a portion of the oxidized unprotected material line so that the etched critical dimension of the at least one etched material line is different from the first critical dimension of the at least one protected material line.

2. The method of claim 1 wherein the etched critical dimension of the material line unprotected material line is less than the critical dimension of the at least one protected material line.

3. The method of claim 1 wherein the etched critical dimension of the material line unprotected material line is greater than the critical dimension of the at least one protected material line.

4. The method of claim 1 wherein the oxidizing comprising fully oxidizing the at least one unprotected material line.

5. The method of claim 1 wherein the oxidizing comprising partially oxidizing the at least one unprotected material line.

6. The method of claim 1 further comprising:
    removing the protective layer;
    forming a patterned hard mask layer from the hard mask layer using at least one protected material line and the at least one etched material line; and
    wherein the patterned hard mask layer comprise material lines having the different critical dimensions.

7. The method of claim 6 further comprising:
    forming a patterned layer from the patternable layer using the patterned hard mask layer; and wherein the patterned layer comprises material lines having the different critical dimensions.

8. The method of claim 7 wherein the starting semiconductor structure is situated over a bulk semiconductor substrate, and further comprising using to the patterned layer having the different critical dimensions to form finFETS, dummy gates, back end of line (BEOF) features, or front end of line (FEOL) features.

9. A method comprising:
providing a starting semiconductor structure comprising a plurality of material lines disposed over a hard mask, and the hard mask disposed over a patternable layer;
oxidizing the plurality of material lines;
forming a protective layer over at least one of the plurality of oxidized material lines, the at least one protected oxidized material line and at least one unprotected oxidized material line having a same critical dimension; and
etching at least a portion of the oxidized unprotected material line so that the etched critical dimension of the at least one etched material line is different from the first critical dimension of the at least one protected material line.

10. The method of claim 9 wherein the etched critical dimension of the material line unprotected material line is less than the critical dimension of the at least one protected material line.

11. The method of claim 1 wherein the oxidizing comprising fully oxidizing the at least one unprotected material line.

12. The method of claim 1 wherein the oxidizing comprising partially oxidizing the at least one unprotected material line.

13. The method of claim 1 further comprising:
removing the protective layer;
forming a patterned hard mask layer from the hard mask layer using at least one protected material line and the at least one etched material line to form; and
wherein the patterned hard mask layer comprise material lines having the different critical dimensions.

14. The method of claim 13 further comprising:
forming a patterned layer from the patternable layer using the patterned hard mask layer; and
wherein the patterned layer comprise material lines having the different corresponding critical dimensions.

15. The method of claim 14 wherein the starting semiconductor structure is situated over a bulk semiconductor substrate, and further comprising using to the patterned layer having the different critical dimensions to form finFETS, dummy gates, back end of line (BEOF) features, or front end of line (FEOL) features.

16. An intermediate semiconductor structure comprising:
a first plurality of material lines and a second plurality of material lines disposed over a hard mask, the hard mask disposed over a patternable layer, and the patentable layer disposed over a bulk semiconductor substrate;
said second plurality of material lines comprising etched oxide or having oxide removed;
said first plurality of material lines having first critical dimension and said second plurality of material lines having a corresponding second critical dimension, and
wherein said first critical dimension being different from said second critical dimension.

17. The intermediate semiconductor structure of claim 16 wherein said second critical dimension being less than said first critical dimension.

18. The intermediate semiconductor structure of claim 16 wherein said second critical dimension being greater than said first critical dimension.

19. The intermediate semiconductor structure of claim 16 wherein said first plurality of material lines and said second plurality of material lines comprise different materials, and said second plurality of material lines comprise an oxide.

20. The intermediate semiconductor structure of claim 16 wherein said intermediate semiconductor structure is operable to form finFETS, dummy gates, back end of line (BEOF) features, or front end of line (FEOL) features.

* * * * *